United States Patent [19]

Sato et al.

[11] Patent Number: 4,814,731

[45] Date of Patent: Mar. 21, 1989

[54] SUPERCONDUCTING DIPOLE ELECTROMAGNETS AND PROCESS FOR PRODUCING THE SAME

[75] Inventors: Kenichi Sato; Nobuhiro Shibuta, both of Osaka, Japan

[73] Assignee: Sumitomo Electric Industries, Ltd., Osaka, Japan

[21] Appl. No.: 22,626

[22] Filed: Mar. 5, 1987

[30] Foreign Application Priority Data

| | | | |
|---|---|---|---|
| Mar. 5, 1986 | [JP] | Japan | 61-50051 |
| Feb. 24, 1987 | [JP] | Japan | 62-42251 |
| Feb. 24, 1987 | [JP] | Japan | 62-42253 |

[51] Int. Cl.[4] ........ H01F 7/22; H01L 39/24

[52] U.S. Cl. ........ 335/216; 29/599; 242/7.07; 242/7.11

[58] Field of Search ........ 29/599; 335/216; 242/7.07, 7.11

[56] References Cited

U.S. PATENT DOCUMENTS

| | | | |
|---|---|---|---|
| 3,626,341 | 12/1971 | Dao | 335/216 |
| 4,271,585 | 6/1981 | Satti | 29/599 |

FOREIGN PATENT DOCUMENTS

| | | | |
|---|---|---|---|
| 54-97715 | 8/1979 | Japan | 29/599 |
| 57-78111 | 5/1982 | Japan | 335/216 |
| 58-130769 | 8/1983 | Japan | 29/599 |

*Primary Examiner*—Carl J. Arbes

*Attorney, Agent, or Firm*—Wenderoth, Lind & Ponack

[57] ABSTRACT

An improved process for producing superconducting dipole electromagnets is proposed. A plurality of coil cables are fed simultaneously toward and wound around a core so as to form a plurality of layers superimposed upon one another in the direction of thickness of the core. This makes it possible to decrease the size of power supply, lead wires, power cables, etc., to cut down the consumption of refrigerant, and to reduce accumulated energy level.

20 Claims, 3 Drawing Sheets

SUPERCONDUCTING DIPOLE ELECTROMAGNETS AND PROCESS FOR PRODUCING THE SAME

BACKGROUND OF THE INVENTION

1. Field of the Invention

The present invention relates to a superconducting saddle-shaped dipole electromagnet mainly used to deflect charged particles (such as electrons and ions) and a process for producing the same.

2. Description of the Prior Art

Among electromagnets for deflecting charged particles, two types are known, namely a normal conducting type and a superconducting type. The former has a magnetic flux density of only about 1.5 teslas, and not only is it large in size and heavy in weight but its running cost is rather high. It is therefore customary to use a superconducting electromagnet having a higher magnetic flux density and requiring no energizing after the permanent current mode has been reached, for an apparatus requiring the deflection of charged particles having a large energy, such as an ion implantation apparatus having a tendency to increase the particle energy, or a syncrotron orbital radiation (SOR) apparatus.

A saddle-shaped dipole electromagnet as shown in FIG. 4 is usually used for deflection because it has an excellent uniformity in magnetic field and is provided with an effective countermeasure to the magnetic force. It has been customary to use Keystoned type cables having a large sectional area (approximately 10 $mm^2$) and an inverted trapezoidal sectional shape, as a cable for saddle-shaped coils 2 wound on a beam duct 1 opposite to each other. Since the excitation current of this type of cable is as high as several thousand amperes, it requires a high-output power source. Also, the lead wire has such a large sectional area that a great amount of heat generated in the lead wire is liable to leak into the cryostat housing the coils. Consequently, evaporation of a refrigerant (generally liquid helium) for cooling down the coils housed in the cryostat increases leading to an increase in the running costs.

One solution to the above problems is to use a cable having a high aspect ratio with the same width but tis thickness decreased to one-third to one-tenth that of the conventional cable in place of a customarily used strand having a thickness of about 1 mm and a width of about 10 mm and made by stranding 20 or more element wires. But, in this case, the diameter of each element wire has to be reduced to one-third to one-fifth of that of a conventional one. This causes an increase in cost for wire drawing and makes the stranding work extremely difficult. Such a method is not a practical solution.

Using a small-sized cable to lower the current intensity will only increase the time required to wind a predetermined quantity of cable.

In winding a saddle-shaped coil, it is usually necessary to stack one layer upon another in the direction of thickness of the coil to form a several-layered structure so as to obtain the same quantity of winding. Since the winding is carried out from the inner layer toward the outer layer, as shown in FIG. 1 by arrows, it is impossible to form a continuous coil using a single cable with each layer interconnected to the adjacent layers. Instead, a cable has to be cut off every time one layer is wound up, and each layer has to be interconnected to its adjacent layers using crossovers at the last stage. This is very troublesome to do.

SUMMARY OF THE INVENTION

An object of the present invention is to provide a process for manufacturing superconducting saddle-shaped dipole electromagnets in an easier way which obviates the abovesaid shortcomings.

According to the present invention, a plurality of coil cables or wires are fed simultaneously in parallel with one another and wound at the same time to form several coil layers arranged one upon another in the direction of the thickness of the coil. Thereby the time required for winding is not prolonged even if coil cables having a small sectional area are used to minimize the current intensity required.

Further, since a monolithic wire having a small aspect ratio or a sub-strand cable made by dividing a conventional cable can be used as a coil cable, problems accompanying the use of thinner wires such as an increase in wire drawing cost and a difficulty in stranding can be solved. Using the monolithic wires will further provide a compact electromagnet.

A plurality of coil layers formed by the cables fed simultaneously are to be interconnected via crossovers. Since the cables forming different coil layers are wound around simultaneously, it eliminates the need of cutting the cable at the end of each coil layer and winding from the start point of the next layer all over again as in the conventional process.

According to the present invention, an economical superconducting electromagnet is provided which does not require a large current intensity for magnetization and demagnetization, which eliminates the need of a high-output power source and the use of lead wires having a large sectional area, thus significantly decreasing the evaporation of a refrigerant owing to the heat leakage from the lead wires.

Any superconducting electromagnets using saddle-shaped dipole coils are to be included in the scope of the present invention whether or not they are used for deflecting charged particles.

An electromagnet according to the present invention made by winding cables, each of which comprises a bundle of sub-cables, has substantially the same outer shape as a conventional electromagnet, but the number of turns of winding increases n-fold according to the number n of sub-cables bundled in one cable while the current passing through each sub-cable decreases to $1/n$ in inverse proportion to the number n.

Therefore, if the sub-cables are interconnected at necessary points so that the current fed from one end of one of the sub-cables will flow to the subsequent sub-cables one after another until it reaches the other end of the last one, the capacity of power supply can be reduced to $1/n$, and the capacity of the other components such as lead wires can also be reduced to $1/n$ of a conventional conductor.

Also, in accordance with the present invention, there is provided a superconducting electromagnet which makes it possible to decrease the sizes of a power supply, lead wires, power cables, permanent current switches, protection resistors, etc., to drastically cut down the consumption of refrigerant, and to reduce accumulated energy level. Namely, the problem of deterioration in the winding condition and winding efficiency can be solved by dividing a coil cable into a plurality of sub-cables and bundling the sub-cables to an integrated body before winding. Thus with this invention a high-performance superconducting magnet is provided which is less likely to cause quenching, and can be energized with a smaller number of times of trainings and which can be wound up in a very short period of time.

BRIEF DESCRIPTION OF THE DRAWINGS

Other objects and features of the present invention will become apparent from the following description with reference to the accompanying drawings, in which.

DETAILED DESCRIPTION OF THE PREFERRED EMBODIMENTS

Figure 1:
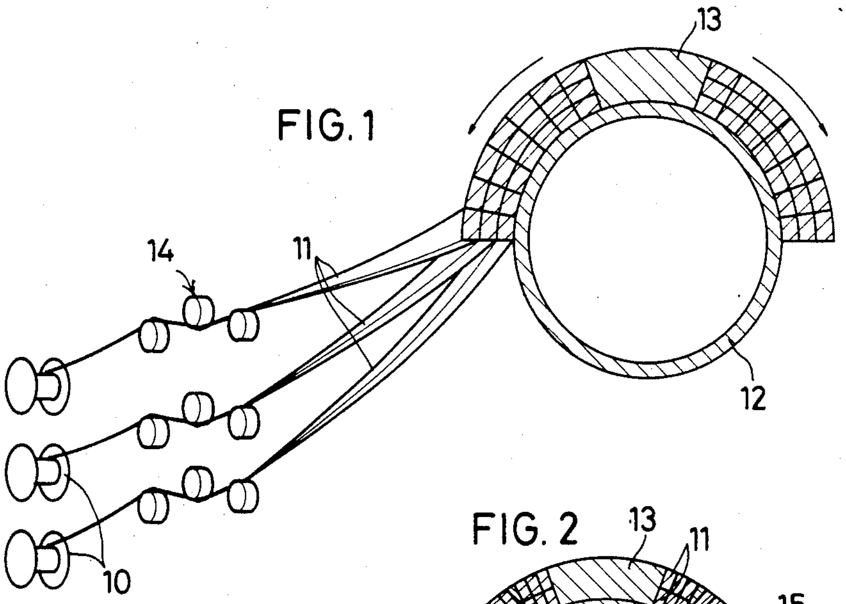
FIG. 1 is a diagrammatic view showing the first embodiment of the process in accordance with the present invention.

In accordance with the present invention, as shown in FIG. 1, a plurality of coil cables or wires 11, each of which comprises a sub-cable, are fed simultaneously from feeders 10 and wound simultaneously around a core spacer 13 mounted on a reel 12 so as to be stacked one upon another in the direction of the thickness of the coil to thereby form a sub-divided cable. It is preferable to use tension rollers 14 or the like to control the tension of the coil cables 11 simultaneously fed from the feeders 10.

Figure 2:
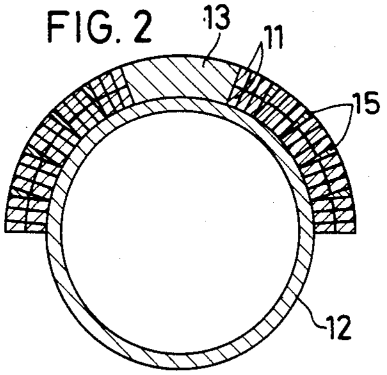
FIGS. 2 and 3 are sectional views of coils with spacers inserted into gaps between the turn layers.
Figure 3:
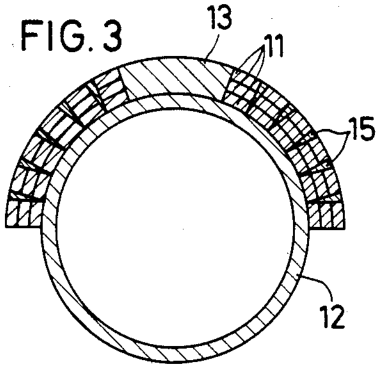
Figure 4:
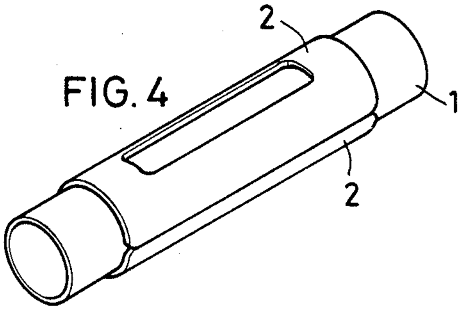
FIG. 4 is a perspective view of a typical super-conducting saddle-shaped dipole electromagnet.

The coil cables 11 used should preferably be monolithic wires having a sectional area which is one-third to one-tenth of that of a conventional cable, or sub-strand cables made by subdividing conventional strand cables so that the sectional area of the sub-strand will be one-third to one-tenth of that of a conventional one. If monolithic wires are used, gaps are formed between turn layers of the wires. Spacers 15 of fiber reinforced plastic (FRP) or metal should preferably be inserted into the gaps, between every several layers as shown in FIG. 2 or into all gaps as shown in FIG. 3, to fill the gaps while winding if necessary to maintain the accuracy of shape of the coil. In spite of the fact that the gaps are filled with the spacers, the packing factor when the monolithic wires are used is still better than the packing factor when the strand cables are used (normally about 85 percent). Although strand cables may be used in this invention, therefore, monolithic wires can be said to be more advantageous for the compactness of an electromagnet.

Figure 5:
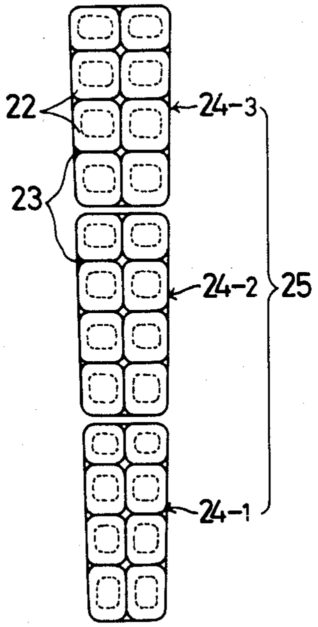
FIG. 5 is a sectional view of an embodiment of a cable used for producing a superconducting electromagnet of the present invention.
Figure 6:
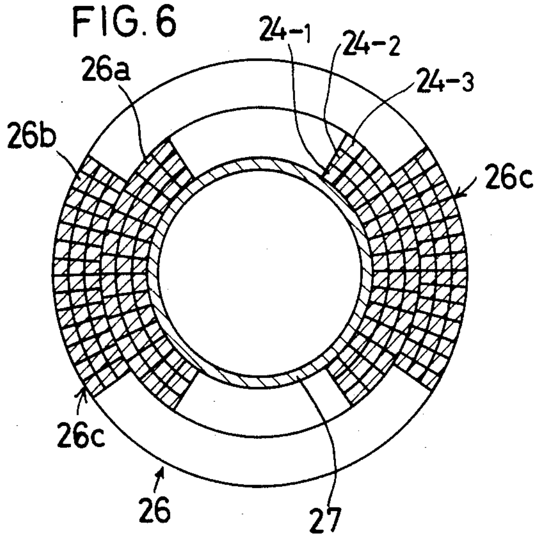
FIG. 6 is a transverse sectional view of coil formed by winding the cables of FIG. 5.
Figure 7:
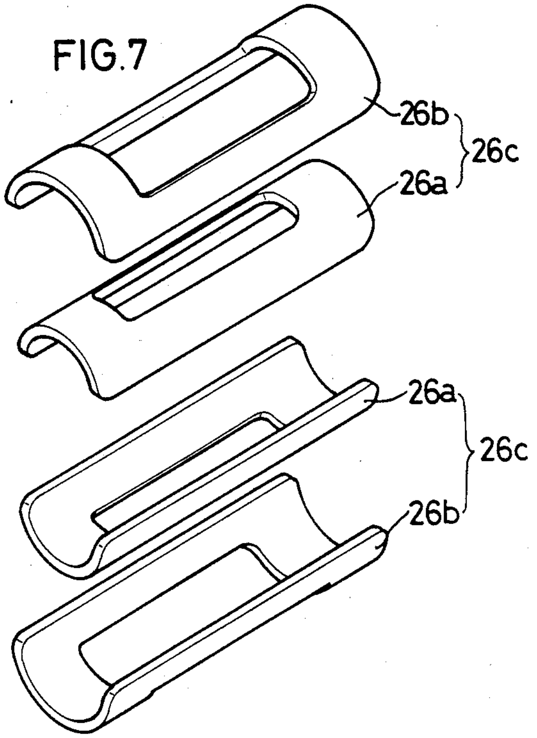
FIG. 7 is an exploded perspective view showing the coil of FIG. 6.

Referring to FIG. 5, sub-cables 24-1, 24-2 and 24-3 were made by stranding together eight Cu covered NbTi super-conducting element wires 22, each having a diameter of 0.81 mm and then wrapping a polyimide tape around each stranded cable to give insulating properties to the cables (numeral 23 designates the insulating layers). A sub-divided cable 25 is formed from three such sub-cables were put one upon another in the direction of width with their both sides tapered and their thicknesses increasing gradually from 24-1 toward 24-3, so that the sectional shape of the assembly will substantially coincide with that of a Keystoned type cable having a short lower side of 1.26 mm, a long upper side of 1.60 mm and the width between the short lower side and the long upper side of 9.92 mm and made by stranding twenty-four superconducting element wires of the same diameter and provided with an insulating layer of polyimide tape around the cables. This assembly or sub-divided cable 25 consisting of three sub-cables having substantially flat abutting surfaces was then wound around a beam chamber 27 into a superconducting coil 26 having a saddle-shaped section as shown in FIG. 6. Two coils **26*c* each comprising a lower coil 26*a* and an upper coil 26*b* were mounted on opposite sides of the beam chamber 27 with the short side of the sub-cable 24-1** on the beam chamber.

Figure 8:
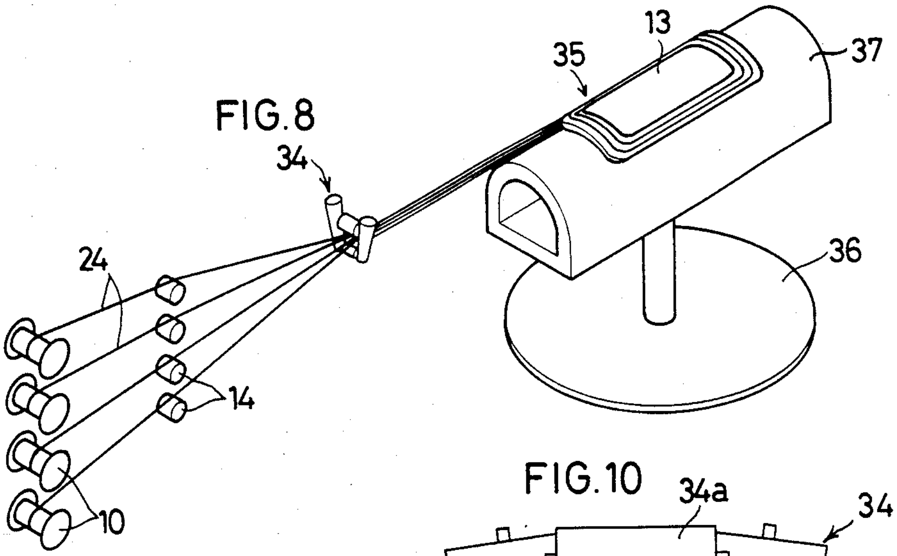
FIG. 8 is a diagrammatic perspective view showing an embodiment of the process of the present invention.
Figure 9:
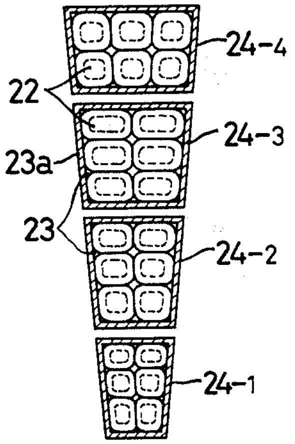
FIG. 9 is a sectional view of an embodiment of sub-cables to be bundled.

Referring to FIG. 8, four sub-cables 24 are fed from feeders 10. As shown in FIG. 9, each of the sub-cables 24 is made by stranding six superconducting element wires 22 and insulating the strand with a polyimide tape 23 coated with epoxy resin **23*a* of stage B. These four sub-cables 24 are fed through a tension control device (not shown) using tension rollers and through guide rollers 14 to a bundling unit 34 where the sub-cables are aligned and fed to a winding station 35. The winding station comprises a spool 37 mounted on a turntable 36 and a core 13 secured to the spool. The sub-cables 24 thus bundled are wound around the core 13 on the spool 37 while being stacked one upon another in the direction of thickness of the core 13. Although in FIG. 8 the sub-cables are wound by turning the spool 37**, they may be turned around the fixed reel for winding.

Figure 10:
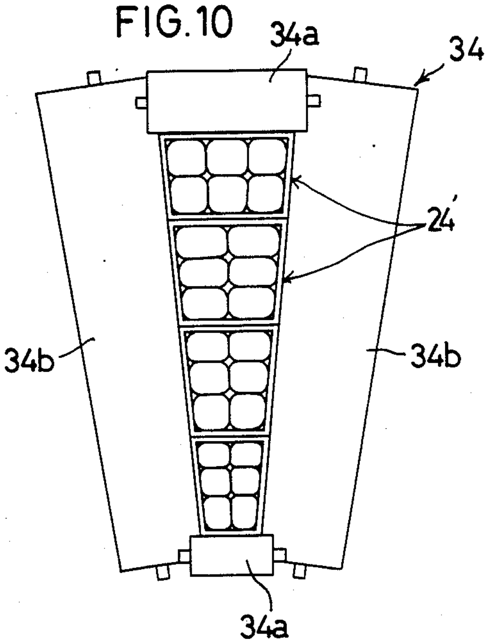
FIG. 10 is a front view of an example of bundling device.

The bundling device 34 shown in FIG. 10 is preferable because of its simple structure. The devices comprises two horizontal transverse rolls **34*a* and two longitudinal rolls 34*b*** inclined so as to coincide with the taper of sides of a Keystoned type cable. The longitudinal and transverse rolls may be slightly displaceable in the direction of movement of the cables, or may be arranged flush with each other if there is enough room for this arrangement. What is important is that the four rollers are arranged to hold and bundle the sub-cable into a predetermined sectional shape.

Otherwise, the sub-cables may be bundled and integrated by bonding or taping in another line and then fed from the feeders 10.

Referring to FIG. 9, six Cu covered NbTi super-conducting element wires 22 having a diameter of 0.8 mm were stranded and insulated with Kapton tape (trade name) around each stranded wire to form a sub-cable 24-1 to 24-4. These four sub-cables were given such shapes that the shape will be substantially the same as that of a Keystoned type cable when assembled together in the direction of width.

Figure 11:
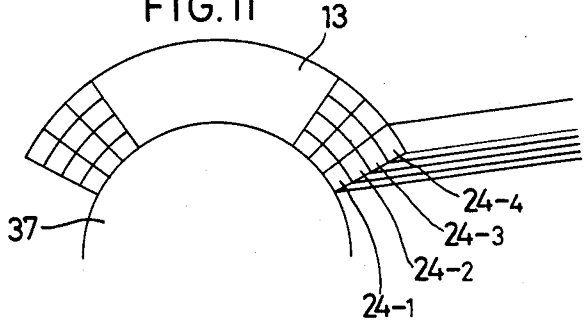
FIG. 11 is an enlarged exemplary view showing how the sub-cables are wound.

Four such sub-cables 24 were fed from the feeders 10 through tension control devices (not shown) to the bundling device 34. The cables were then wound flatwise around the core 13 using the winder 35 of FIG. 8, the spool 37 of which is adapted to rotate, as shown in FIG. 11. As a result, it was found out that a tight winding was achieved without any gaps formed in between, and the time taken for winding was essentially the same as for winding a single Keystoned type cable. Coil energizing tests revealed that only once or twice of trainings suffice to generate a predetermined magnetic field.

When the sub-cables were wound without bundling them beforehand, the winding itself turned out to be difficult because the sub-cables were liable to be out of place, and quenching occurred at a lower level than a target magnetic field. Thus, a magnet of high quality was not obtainable.

What is claimed is:

1. A superconducting saddle-shaped dipole electromagnet, comprising:

a core and an elongated insulated sub-divided cable extending around said core a plurality of times such that at least two adjacent turns along the length of said sub-divided cable surround said cable, said sub-divided cable comprising a plurality of sub-cables arranged in a row with each of said sub-cables adjacent to and abutting at least another one of said sub-cables, each of said sub-cables including at least one substantially flat surface abutting a substantially flat surface of another one of said sub-cables.

2. The superconducting saddle-shaped dipole electromagnet of claim 1, wherein each of said sub-cables is trapezoidal in cross section taken in a direction perpendicular to the length of said sub-divided cable, each of said sub-cables being progressively larger in trapezoidal cross section such that said sub-divided cable comprising said row of adjacent sub-cables has an inverted trapezoidal cross-section taken in a direction perpendicular to the length thereof.

3. The superconducting saddle-shaped dipole elecrtromagnet of claim 1, wherein each of said sub-cables comprises an insulating layer of material surrounding a plurality of metal coated elongated members selected from the group consisting of coil cables and wires.

4. The superconducting saddle-shaped dipole electromagnet of claim 1, wherein said sub-divided cable comprises at least three of said sub-cables.

5. The superconducting saddle-shaped dipole electromagnet of claim 3, wherein said elongated members are copper coated niobium-titanium wires.

6. The superconducting saddle-shaped dipole electromagnet of claim 1, further comprising a plurality of spacers, each of which is between adjacent turns of said sub-divided cable.

7. A process for producing superconducting saddle-shaped dipole electromagnets, comprising the steps of simultaneously feeding a plurality of coil cables or wires and winding the same simultaneously around a core so as to form a plurality of layers put one upon another in the direction of thickness of the coil, said coil cables or wires being adapted to and having such sectional shapes as to align in the direction of thickness into a single coil cable or wire when wound around said core.

8. A process as claimed in claim 7, further comprising the step of inserting a plurality of spacers at regular intervals into at least some of radial gaps formed between turns around said core so that said spacers will extend radially through said plurality of layers.

9. A process as claimed in claim 7, further comprising the steps of stranding a plurality of wires into a sub-cable which is said each coil cable and insulating said each sub-cable before being fed and wound around said core.

10. A process as claimed in claim 9, further comprising the step of bundling said sub-cables to form an assembly having a predetermined sectional shape before being wound around said core.

11. A process as claimed in claim 10, wherein said sub-cables have such sectional shapes as to be bundled into an inverted trapezoidal sectional shape so that no radial gaps will be formed between turns around said core when wound therearound.

12. A process for producing superconducting saddle-shaped dipole electromagnets, comprising:

forming a sub-divided cable from a plurality of elongated members selected from the group consisting of coil cables and wires, groups of said elongated members being arranged together into a plurality of sub-cables which together form said sub-divided cable, said sub-divided cables being formed by arranging said sub-cables in a row such that each of said sub-cables has a substantially flat surface thereon abutting a substantially flat surface of at least another one of said sub-cables; and winding said sub-divided cable around a core a plurality of times to thereby form at least two adjacent turns of said sub-divided cable around said core.

13. The process of claim 12, further comprising inserting spacers into radial gaps formed between adjacent turns of said sub-divided cable.

14. The process of claim 12, further comprising forming said sub-cables by stranding a plurality of wires and encasing said plurality of wires in an insulating layer of material.

15. The process of claim 12, further comprising bundling said sub-cables in a predetermined shape prior to said winding step.

16. A process for producing superconducting saddle-shaped dipole electromagnets, comprising the steps of stranding a plurality of wires into a plurality of sub-cables and insulating each of said sub-cables from each other, bundling said sub-cables to form an assembly having a predetermined sectional shape, and simultaneously feeding said assembly comprised of said plurality of wires and winding said assembly around a core so as to form a super-conducting saddle-shaped dipole electromagnet, said sub-cables having respective sectional shapes which align in the direction of thickness into a single coil cable or wire when wound around said core.

17. A process as claimed in claim 16, wherein said bundling step precedes said winding step.

18. A process as claimed in claim 16, wherein said respective sectional shapes of said sub-cables align in the direction of thickness to form an inverted trapezoidal sectional shape which prevents radial gaps between turns around said core during said winding step.

19. A process for producing superconducting saddle-shaped dipole electromagnets comprising:

forming a sub-divided cable from a plurality of elongated members selected from the group consisting of coil cables and wires, groups of said elongated members being arranged together into a plurality of sub-cables which together form said sub-divided cable, said sub-divided cables being formed by arranging said sub-cables in a row and bundling said sub-cables into a predetermined shape, each of said sub-cables having a substantially flat surface thereon abutting a substantially flat surface of at least another one of said sub-cables; and winding said sub-divided cable around a core a plurality of times to thereby form at least two adjacent turns of said sub-divided cable around said core.

20. The process of claim 19, wherein said bundling step is performed prior to said winding step.

* * * * *